"(12) United States Patent
Jeon et al.

US009178030B2

(10) Patent No.: US 9,178,030 B2
(45) Date of Patent: Nov. 3, 2015

(54) THIN FILM TRANSISTOR AND DISPLAY PANEL EMPLOYING THE SAME

(75) Inventors: Sang-hun Jeon, Seoul (KR); I-hun Song, Hwaseong-si (KR); Chang-jung Kim, Yongin-si (KR); Seung-eon Ahn, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 82 days.

(21) Appl. No.: 13/616,964

(22) Filed: Sep. 14, 2012

(65) Prior Publication Data

US 2013/0208204 A1 Aug. 15, 2013

(30) Foreign Application Priority Data

Feb. 13, 2012 (KR) ........................ 10-2012-0014404

(51) Int. Cl.
| G02F 1/136 | (2006.01) |
| H01L 29/45 | (2006.01) |
| G02F 1/1368 | (2006.01) |
| G06F 3/042 | (2006.01) |
| H01L 29/49 | (2006.01) |
| H01L 29/786 | (2006.01) |
| G02F 1/1333 | (2006.01) |

(52) U.S. Cl.
CPC .............. *H01L 29/45* (2013.01); *G02F 1/1368* (2013.01); *G02F 1/13338* (2013.01); *G06F 3/0421* (2013.01); *H01L 29/4908* (2013.01); *H01L 29/7869* (2013.01); *H01L 29/78606* (2013.01); *G06F 2203/04103* (2013.01)

(58) Field of Classification Search
CPC ..................... H01L 29/7869; H01L 29/66742; H01L 29/4908; H01L 29/78696; H01L 29/786; H01L 29/41733; H01L 29/458; H01L 29/66765; H01L 29/78693; H01L 27/1214; H01L 27/3262; H01L 27/1251; H01L 27/127; H01L 27/3244; H01L 21/02565; H01L 21/02554; H01L 33/42; H01L 27/326; H01L 27/3276; H01L 51/102; G02F 1/1368; G02F 1/136286; G02F 1/1362; G02F 1/136227; G02F 1/1333; G02F 1/1343; G02F 1/134309; G02F 1/13624; G02F 1/13338; G02F 1/134336; G02F 1/136209; G02F 1/133345; G02F 1/133512; G02F 1/133528; G02F 1/133533; G02F 1/136; G02F 2001/13629; G02F 2201/122; G02F 1/1335; G02F 1/133514; G02F 1/13454; G02F 1/133; G02F 2201/40; G02F 2201/12; G02F 2201/123; G09G 2300/0809; G09G 2300/0426; G09G 2300/0439; G09G 3/3648; G06F 3/041
USPC ...................... 257/43, 59, E29.273, E21.158, 257/E21.409, E27.06, E27.112, 72, 257/E33.062; 349/43, 143, 42, 46, 106, 349/123, 138, 41, 12, 139; 438/158, 104, 438/479, 154, 652, 149, 151; 345/173, 92, 345/55, 87
See application file for complete search history.

(56) References Cited

U.S. PATENT DOCUMENTS

| 7,964,871 | B2 | 6/2011 | Iwasaki |
| 7,988,470 | B2 | 8/2011 | Ye |

(Continued)

FOREIGN PATENT DOCUMENTS

| JP | 200773703 A | 3/2007 |
| KR | 1020100114842 A | 10/2010 |

*Primary Examiner* — Thoi Duong
(74) *Attorney, Agent, or Firm* — Sughrue Mion, PLLC

(57) ABSTRACT

A thin film transistor is provided. The transistor includes a gate; a first passivation layer covering the gate; a channel layer disposed on the first passivation layer; a source and a drain that are disposed on the first passivation layer and contact two sides of the channel layer; a second passivation layer covering the channel layer, the source, and the drain; first and second transparent electrode layers that are disposed on the second passivation layer and spaced apart from each other; a first transparent conductive via that penetrates the second passivation layer and connects the source and the first transparent electrode layer; and a second transparent conductive via that penetrates the second passivation layer and connects the drain and the second transparent electrode layer. A cross-sectional area of the gate is larger than a cross-sectional area of the channel layer, the source, and the drain combined.

18 Claims, 7 Drawing Sheets

(56) References Cited

U.S. PATENT DOCUMENTS 8,310,648 B2 * 11/2012 Moon et al. ................... 349/187
2002/0075421 A1 * 6/2002 Wu ................................. 349/43
2011/0062435 A1 * 3/2011 Yamazaki et al. .............. 257/43

* cited by examiner

THIN FILM TRANSISTOR AND DISPLAY PANEL EMPLOYING THE SAME

CROSS-REFERENCE TO RELATED APPLICATIONS

This application claims priority from Korean Patent Application No. 10-2012-0014404, filed on Feb. 13, 2012, in the Korean Intellectual Property Office, the disclosure of which is herein incorporated by reference in its entirety.

BACKGROUND

1. Field

The present disclosure relates to a thin film transistor and a display panel employing the same.

2. Description of the Related Art

Thin film transistors are used in various applications. In particular, thin film transistors are used as switching and driving devices in a display field.

Recently, a thin film transistor used as an optical sensing device of an optical touch screen apparatus has been proposed. In a touch screen apparatus, if a user touches a specific position on a display screen by using a finger or a pen, a specific process may be performed by using software to determine the position, and thus the touch screen apparatus may directly receive input data on the display screen. An existing touch screen apparatus that is widely used uses a direct-touch method in which a user directly touches a screen of a display apparatus by using a finger, a pen, or the like. However, as display apparatuses become larger, when a distance between a user and a display apparatus is increased, it may be difficult to use such a direct-touch method. Optical touch screen apparatuses may perform the same function as an existing touch screen by sensing light instead of a finger or a pen. Optical touch screen apparatuses are expected to be advantageous for communication between users as well as communication between a user and a terminal.

As such, when a thin film transistor is used in a display device, performance of the thin film transistor greatly depends on a semiconductor material forming a channel layer, and performance of the channel layer greatly deteriorates due to external light or temperature. Also, when a liquid crystal display device, which is a non-emissive display device, is used as a display device, a backlight may further be included as an image forming light source. When light is incident on a channel layer, performance of the channel layer may deteriorate.

SUMMARY

Provided is a thin film transistor having a structure in which incidence of external light on a channel layer may be decreased, and a display panel employing the thin film transistor.

According to an aspect of an embodiment, there is provided a thin film transistor including: a gate; a first passivation layer covering the gate; a channel layer disposed on the first passivation layer; a source disposed on the first passivation layer and contacting a first side of the channel layer; a drain disposed on the first passivation layer and contacting a second side of the channel layer; a second passivation layer covering the channel layer, the source, and the drain; a first transparent electrode layer and a second transparent electrode layer that are formed on the second passivation layer and spaced apart from each other; a first transparent conductive via that penetrates the second passivation layer and connects the source and the first transparent electrode layer; and a second transparent conductive via that penetrates the second passivation layer and connects the drain and the second transparent electrode layer, wherein a cross-sectional area of the gate is larger than a cross-sectional area of the channel layer, the source, and the drain combined.

A size of an area where the source and the drain contact the first passivation layer is such that light obliquely incident from a lateral bottom side of the gate in a direction in which the light is not directed to the gate, transmits through the first and second transparent electrode layers without facing the area where the source and the drain contact the first passivation layer.

The source, the drain, and the gate are formed of a metal material.

The first and second transparent electrode layers and the first and second transparent conductive vias are formed of a transparent conductive oxide.

The channel layer is formed of an oxide semiconductor.

According to an aspect of another embodiment, there is provided a display panel including: a plurality of pixels each including a display cell and a driving transistor that controls an on/off operation of the display cell, the driving transistor includes a gate; a first passivation layer covering the gate; a channel layer disposed on the first passivation layer; a source disposed on the first passivation layer and contacting a first side of the channel layer; a drain disposed on the first passivation layer and contacting a second side of the channel layer; a second passivation layer covering the channel layer, the source, and the drain; a first transparent electrode layer and a second transparent electrode layer that are disposed on the second passivation layer and spaced apart from each other; a first transparent conductive via that penetrates the second passivation layer and connects the source and the first transparent electrode layer; and a second transparent conductive via that penetrates the second passivation layer and connects the drain and the second transparent electrode layer, wherein a cross-sectional area of the gate is larger than a cross-sectional area of the channel layer, the source, and the drain combined.

The display cell is formed of a liquid crystal cell.

A size of an area where the source and the drain contact the first passivation layer is such that light obliquely incident from a lateral bottom side of the gate in a direction in which the light is not directed to the gate, transmits through the first and second transparent electrode layers without facing the area where the source and the drain contact the first passivation layer.

The source, the drain, and the gate are formed of a metal material.

The first and second transparent electrode layers and the first and second transparent conductive vias are formed of a transparent conductive oxide.

The channel layer is formed of an oxide semiconductor.

A black matrix and a color filter are disposed on each of the pixels, the first transparent electrode layer extends from the first transparent conductive via up to an area corresponding to the gate, and a metal electrode is formed from an end of the first transparent electrode layer not connected to the first transparent conductive via up to an area corresponding to the black matrix.

A black matrix and a color filter are disposed on each of the pixels, the second transparent electrode layer extends from the second transparent conductive via up to an area corresponding to the gate, and a metal electrode is formed from an end of the second transparent electrode layer not connected to the second transparent conductive via up to an area corresponding to the black matrix.

According to an aspect of another embodiment, there is provided an optical touch display panel including: a plurality of pixels each including a driving transistor that controls an on/off operation of the display cell, an optical sensing transistor that senses incident light, and a switch transistor that outputs data from the optical sensing transistor, and at least one of the driving transistor, the optical sensing transistor, and the switch transistor includes: a gate; a first passivation layer covering the gate; a channel layer formed on the first passivation layer; a source disposed on the first passivation layer and contacting a first side of the channel layer; a drain disposed on the first passivation layer and contacting a second side of the channel layer; a second passivation layer covering the channel layer, the source, and the drain; a first transparent electrode layer and a second transparent electrode layer that are formed on the second passivation layer and spaced apart from each other; a first transparent conductive via that penetrates the second passivation layer and connects the source and the first transparent electrode layer; and a second transparent conductive via that penetrates the second passivation layer and connects the drain and the second transparent electrode layer, wherein a cross-sectional area of the gate is larger than a cross-sectional area of the channel layer, the source, and the drain combined.

The display cell is formed of a liquid crystal cell.

A size of an area where the source and the drain contact the first passivation layer is such that light obliquely incident from a lateral bottom side of the gate in a direction in which the light is not directed to the gate, transmits through the first and second transparent electrode layers without facing the area where the source and the drain contact the first passivation layer.

The source, the drain, and the gate may comprise a metal material.

The first and second transparent electrode layers and the first and second transparent conductive vias are formed of a transparent conductive oxide.

The channel layer is formed of an oxide semiconductor.

A black matrix and a color filter are disposed on each of the pixels, the first transparent electrode layer extends from the first transparent conductive via up to an area corresponding to the gate, and a metal electrode is formed from an end of the first transparent electrode layer not connected to the first transparent conductive via up to an area corresponding to the black matrix.

A black matrix and a color filter are disposed on each of the pixels, the second transparent electrode layer extends from the second transparent conductive via up to an area corresponding to the gate, and a metal electrode is formed from an end of the second transparent electrode layer not connected to the second transparent conductive via up to an area corresponding to the black matrix.

BRIEF DESCRIPTION OF THE DRAWINGS

These above and/or other aspects will become apparent and more readily appreciated from the following description of embodiments, taken in conjunction with the accompanying drawings of which.

DETAILED DESCRIPTION

Figure 1:
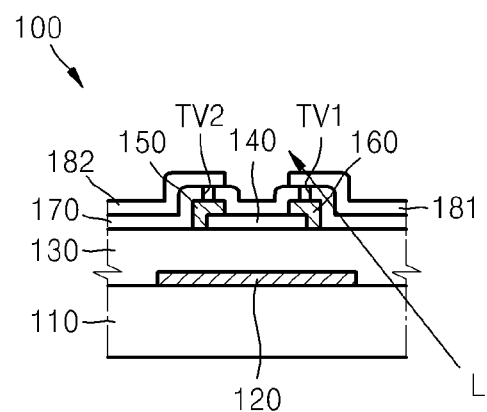
FIG. 1 is a schematic cross-sectional view of a thin film transistor according to an embodiment.

Hereinafter, the various aspects of the present inventive concept will be described in detail by explaining exemplary embodiments with reference to the attached drawings. The same reference numerals in the drawings denote the same element. In the drawings, the thicknesses of layers and regions are exaggerated for clarity.

FIG. 1 is a schematic cross-sectional view of a thin film transistor 100 according to an embodiment.

Referring to FIG. 1, the thin film transistor 100 includes a gate 120 formed on a substrate 110, a first passivation layer 130 covering the gate 120, a channel layer 140 formed on the first passivation layer 130 and formed of a semiconductor material, and a source 160 and a drain 150 that are formed to respectively contact two edges of the channel layer 140. A second passivation layer 170 is formed on the first passivation layer 130 so as to entirely cover the channel layer 140, the source 160, and the drain 150. A first transparent electrode layer 181 and a second transparent electrode layer 182 are formed on the second passivation layer 170 so as to be spaced apart from each other.

In the current embodiment, a cross-sectional area of the gate 120 is formed larger than a cross-sectional area that the channel layer 140, the source 160, and the drain 150 form together. The first transparent electrode layer 181 and the second transparent electrode layer 182 are used as electrode wiring lines used to input/output an electrical signal to/from the source 160 and the drain 150, and accordingly a first transparent conductive via TV1 is formed to penetrate the second passivation layer 170 and connect the source 160 and the first transparent electrode layer 181 and a second transparent conductive via TV2 is formed to penetrate the second passivation layer 170 and connect the drain 150 and the second transparent electrode layer 182.

The substrate 110 may be formed of a material generally used for a substrate, such as glass, silicon, or the like.

The first passivation layer 130 and the second passivation layer 170 may be formed of an insulating material, for example, silicon oxide or silicon nitride. For example, the first passivation layer 130 and the second passivation layer 170 may be formed of $HfO_2$, $Al_2O_3$, or $Si_3N_4$, which have higher dielectric constants than $SiO_2$, or $SiO_2$, or a combination of $HfO_2$, $Al_2O_3$, $Si_3N_4$, or $SiO_2$. Alternatively, the first passivation layer 130 and the second passivation layer 170 may be formed to have a bi-layered structure formed of $HfO_2$, $Al_2O_3$, $Si_3N_4$, or $SiO_2$.

The gate 120, the source 160, and the drain 150 may be formed of a metal having a high electric conductivity, for example, platinum (Pt), ruthenium (Ru), gold (Au), silver (Ag), molybdenum (Mo), aluminum (Al), tungsten (W), copper (Cu), or the like.

The thin film transistor 100 of the current embodiment may be an oxide thin film transistor. In other words, the channel layer 140 may be formed of an oxide semiconductor. Oxide thin film transistors have drawn much attention due to the fact that an oxide thin film transistor may have an advantage of an amorphous silicon thin film transistor (a-Si TFT) and an advantage of a polycrystalline thin film transistor (poly-Si TFT). For example, a zinc oxide (ZnO)-based semiconductor device may be manufactured through a low temperature process and have an amorphous phase, and thus a ZnO-based semiconductor device may be easily made large. Also, a ZnO-based semiconductor film has an excellent electrical characteristic, due to, for example, use of polycrystalline silicon, which is a high-mobility material. The channel layer 140 may be formed of an oxide semiconductor material, such as ZnO, InO, SnO, InZnO, ZnSnO, or InSnO, or the channel layer 140 may be formed of a mixture of any of the above-described oxide semiconductor materials and at least one of Hf, Zr, Ti, Ta, Ga, Nb, V, Al, and Sn. The channel layer 140 may be formed to have a single-layered structure. Alternatively, the channel layer 140 may be formed to have a multi-layered structure in order to improve performance and reliability of the thin film transistor 100.

The first transparent electrode layer 181, the second transparent electrode layer 182, the first transparent conductive via TV1, and the second transparent conductive via TV2 may be formed of a transparent conductive oxide, for example, indium zinc oxide (IZO) or indium tin oxide (ITO).

The thin film transistor 100 having the above-described structure is provided to minimize deterioration of performance of the thin film transistor 100 due to light L incident on the channel layer 140. When the thin film transistor 100 is used as a driving device of a display unit, the light L from outside may be emitted from a backlight provided as image forming light. In such a case, when a part of the light L from a bottom side of the substrate 110 is incident on the channel layer 140, electro-optic reliability is affected. For example, a drain current $I_{DS}$ with respect to a gate voltage $V_{GS}$ is not regular and varies according to time. In the thin film transistor 100 of the current embodiment, incidence of the light L from outside on the channel layer 140 is minimized, thereby preventing electro-optic reliability from being decreased, which will be described with reference to FIG. 2.

Figure 2:
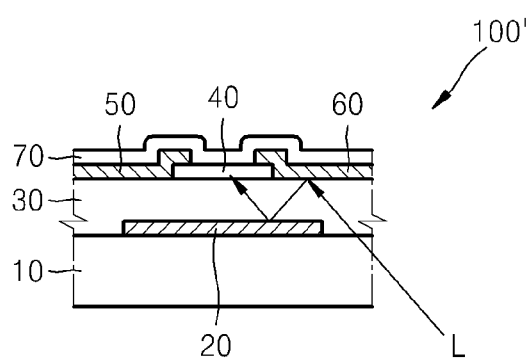
FIG. 2 is a schematic cross-sectional view of a thin film transistor according to a comparative example.

FIG. 2 is a schematic cross-sectional view of a thin film transistor 100' according to a comparative example. The thin film transistor 100' includes a substrate 10, a gate 20 formed on the substrate 10, a first passivation layer 30 covering the gate 20, a channel layer 40 formed on the first passivation layer 30, a source 60 and a drain 50 that are formed on the first passivation layer 30 to respectively contact two edges of the channel layer 40, and a second passivation layer 70 entirely covering the source 60, the drain 50, and the channel layer 40. In the thin film transistor 100', the cross-sectional area that the source 60, the channel layer 40, and the drain 50 form together is larger than a cross-sectional area of the gate 20. The source 60 and the drain 50 also serve as wiring lines used to input/output an electrical signal to/from the channel layer 40.

Referring to FIG. 2, light L from outside may be directed to the channel layer 40 from lateral bottom sides of the gate 20. Also, light directed to the channel layer 40 from the lateral bottom sides of the gate 20 in a direction in which the light is not directed to the gate 20 may be incident on the channel layer 40. Meanwhile, light directed to the channel layer 40 from the lateral bottom sides of the gate 20 in a direction in which the light is not directed to the gate 20 may be incident on the channel layer 40. Thus, as shown in FIG. 2, even through the light L is not directly directed to the channel layer 40, the light L may be guided in a direction toward the channel layer 40 by reflection between a surface of the source 60 or the drain 50 formed of a metal and a surface of the gate 20.

By contrast, as seen in FIG. 1, since the metal forming the gate 120 has a light-reflecting property, the metal may prevent the light L from being incident on the channel layer 140. Moreover, when the cross-sectional area of the gate 120 becomes large compared to that cross-sectional area of the channel layer 1400, such a preventative effect is increased. In the current embodiment, an area where the source 160 and the drain 150 contact the first passivation layer 130 is reduced as much as possible. In other words, as shown in FIG. 1, the light L obliquely incident from the lateral bottom side of the gate 120 in a direction in which the light L is not directed to the gate 120 does not face a bottom surface of the source 160 or the drain 150, and thus the light L penetrates the first transparent electrode layer 181 rather than being reflected, as in the case of the transistor in FIG. 2.

Although light emitted only in one direction is shown in the drawings, in the thin film transistor 100 of FIG. 1, most of light obliquely incident from the lateral bottom side of the gate 120 in a direction in which the light is not directed to the gate 120 is not incident on the channel layer 140, compared with the thin film transistor 100' of FIG. 2.

Figure 3A:
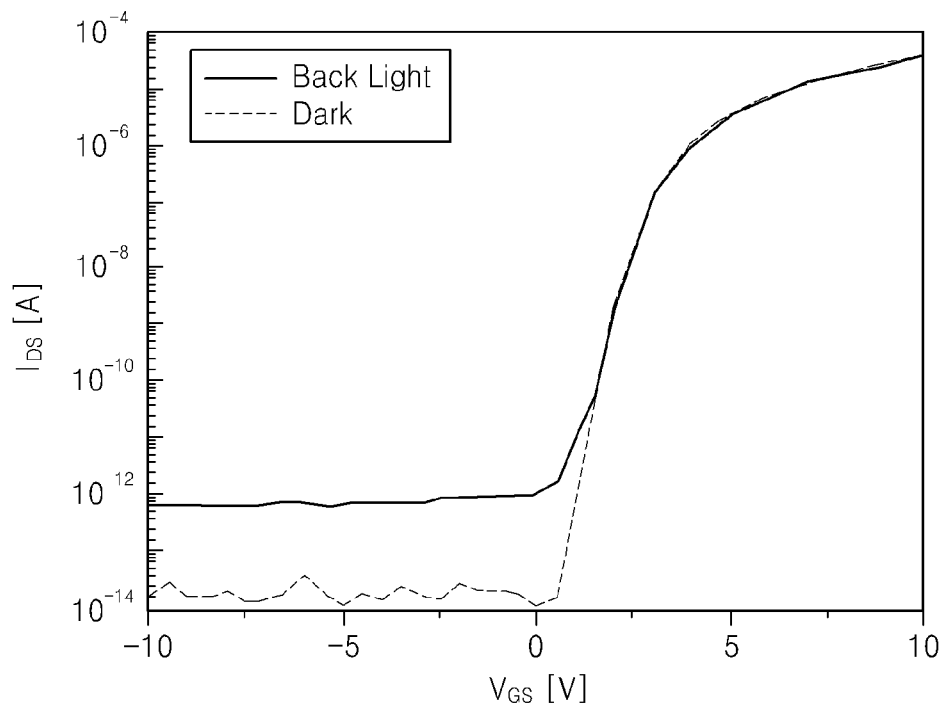
FIGS. 3A to 3C are graphs showing performance characteristics when a size of a gate is changed with respect to the thin film transistor of FIG. 2.
Figure 3B:
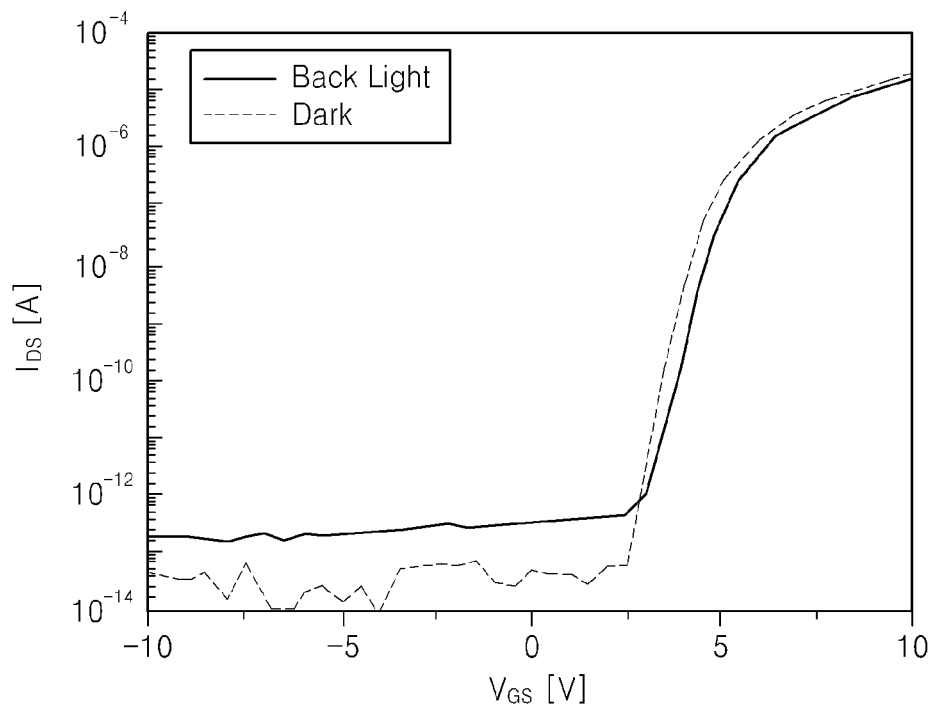
Figure 3C:
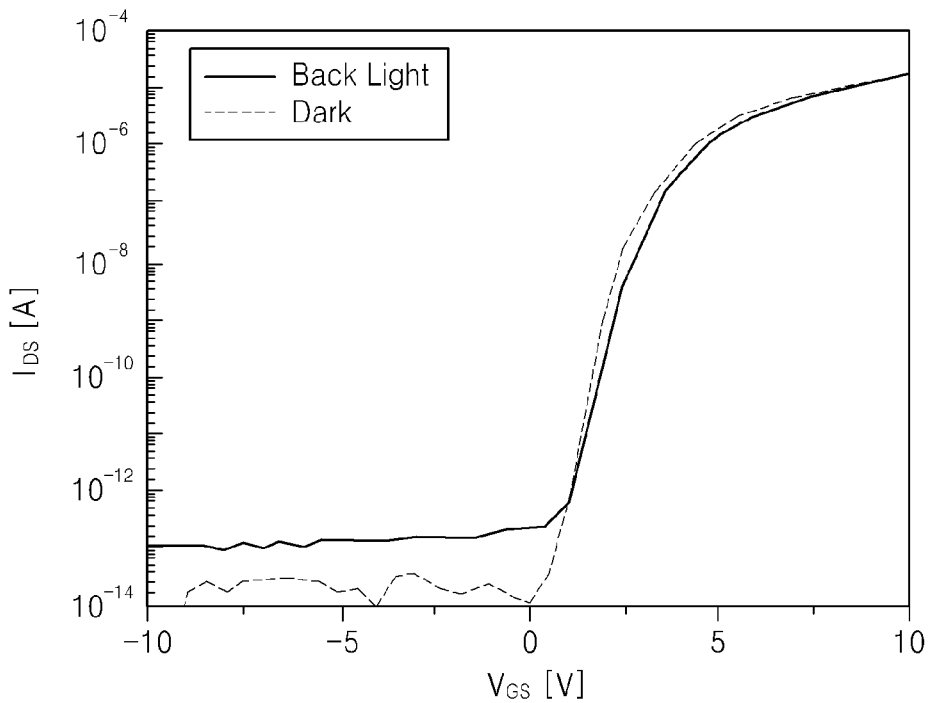

FIGS. 3A to 3C are graphs showing performance characteristics when a size of the gate 20 is changed with respect to the thin film transistor 100' of FIG. 2.

FIGS. 3A to 3C show performance characteristics according to whether backlight exists (Back Light) or not (Dark) when cross-sectional areas of the gate 20 have sizes of 60 um×100 um, 70 um×120 um, and 90 um×140 um, respectively. Referring to FIGS. 3A to 3C, when backlight exists, if a gate voltage VGS lower than a threshold voltage is applied to the thin film transistor 100', a drain current IDS varies according to whether backlight exists or not, which indicates that the amount of light incident on the channel layer 20 affects performance of the thin film transistor 100', and a degree of the effect is decreased as a size of the cross-sectional area of the gate 20 is increased.

Figure 4A:
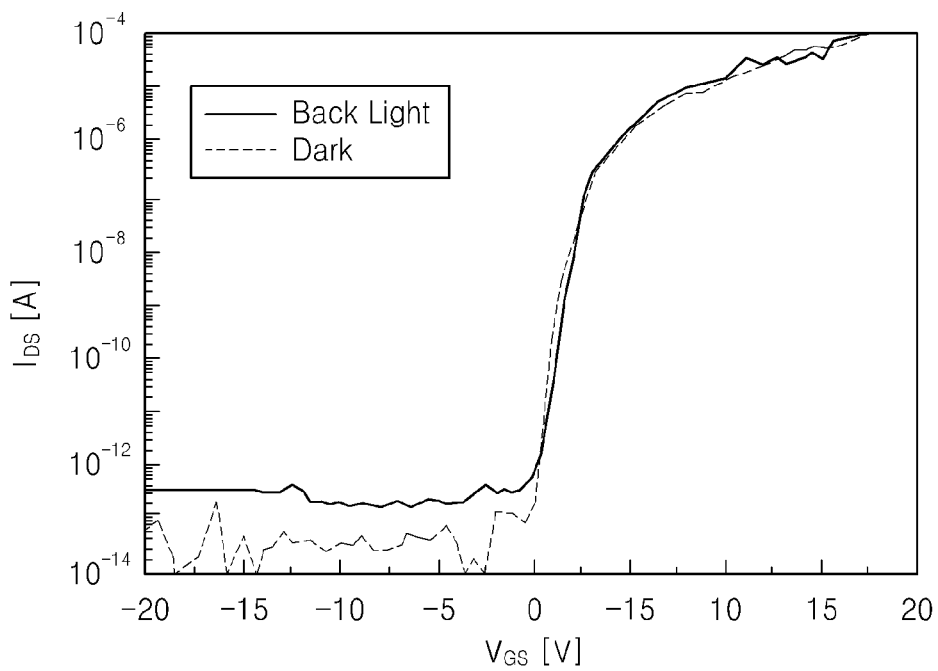
FIGS. 4A to 4C are graphs showing performance characteristics when a size of a gate is changed with respect to the thin film transistor of FIG. 1.
Figure 4B:
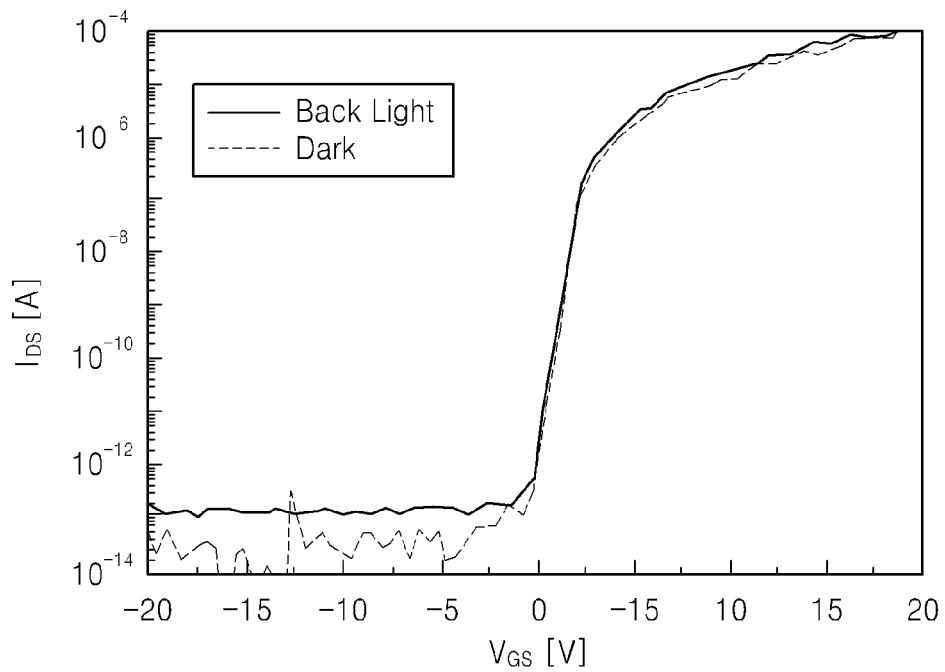
Figure 4C:
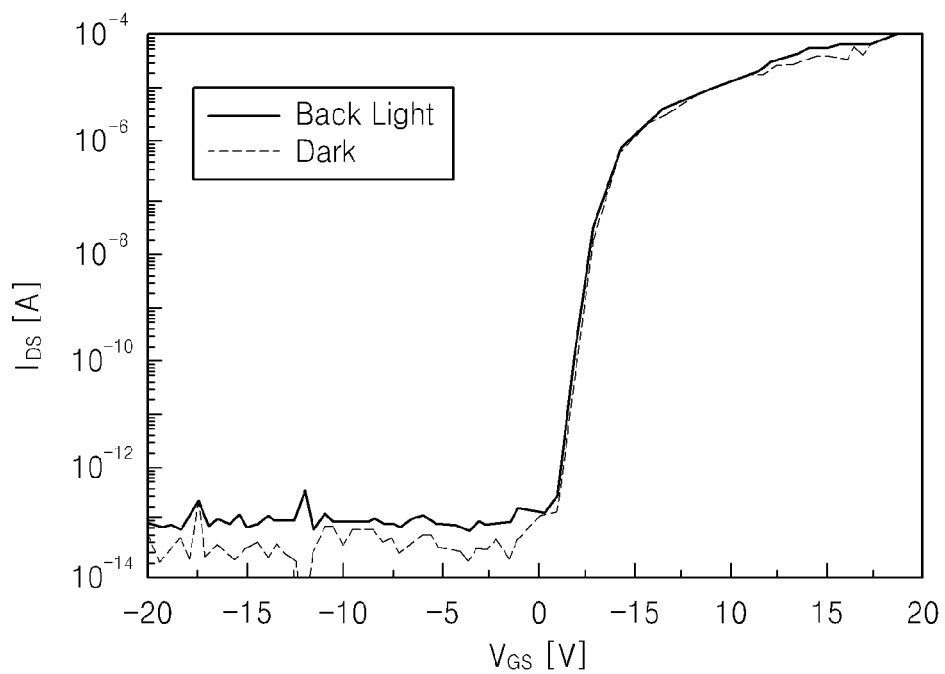

FIGS. 4A to 4C are graphs showing performance characteristics when a size of the gate 120 is changed with respect to the thin film transistor 100.

FIGS. 4A to 4C show performance characteristics according to whether backlight exists (Back Light) or not (Dark) when cross-sections of the gate 120 have sizes of 60 um×100 um, 70 um×120 um, and 90 um×140 um, respectively. Referring to FIGS. 4A to 4C, when backlight exists, if a gate voltage VGS lower than a threshold voltage is applied to the thin film transistor 100, a drain current IDS varies according to whether backlight exists (Back Light) or not (Dark). However, in the current embodiment, since the cross-sectional area that the drain 150, the channel layer 140, and the source 160 form together is smaller than the cross-sectional area of the gate 120, a difference in the drain current IDS according to whether the backlight exists or not is reduced.

In the above-described thin film transistor 100, incidence of external light on the channel layer 140 is minimized by increasing a size of the cross-section of the gate 120. Moreover, in the current embodiment, the first and second transparent conductive vias TV1 and TV2 are introduced. The first and second transparent conductive vias TV1 and TV2 serve as bridges between the source 160 and the first transparent electrode layer 181 and between the drain 150 and the second transparent electrode layer 182, respectively. Also, since the first and second transparent conductive vias TV1 and TV2 may be formed of the same material as the first and second transparent electrode layers 181 and 182, an additional mask is not required during manufacturing of the thin film transistor 100 compared with a conventional process of forming a thin film transistor, and thus the thin film transistor 100 may be manufactured through the same number of processes as a conventional process of forming a thin film transistor.

Figure 5:
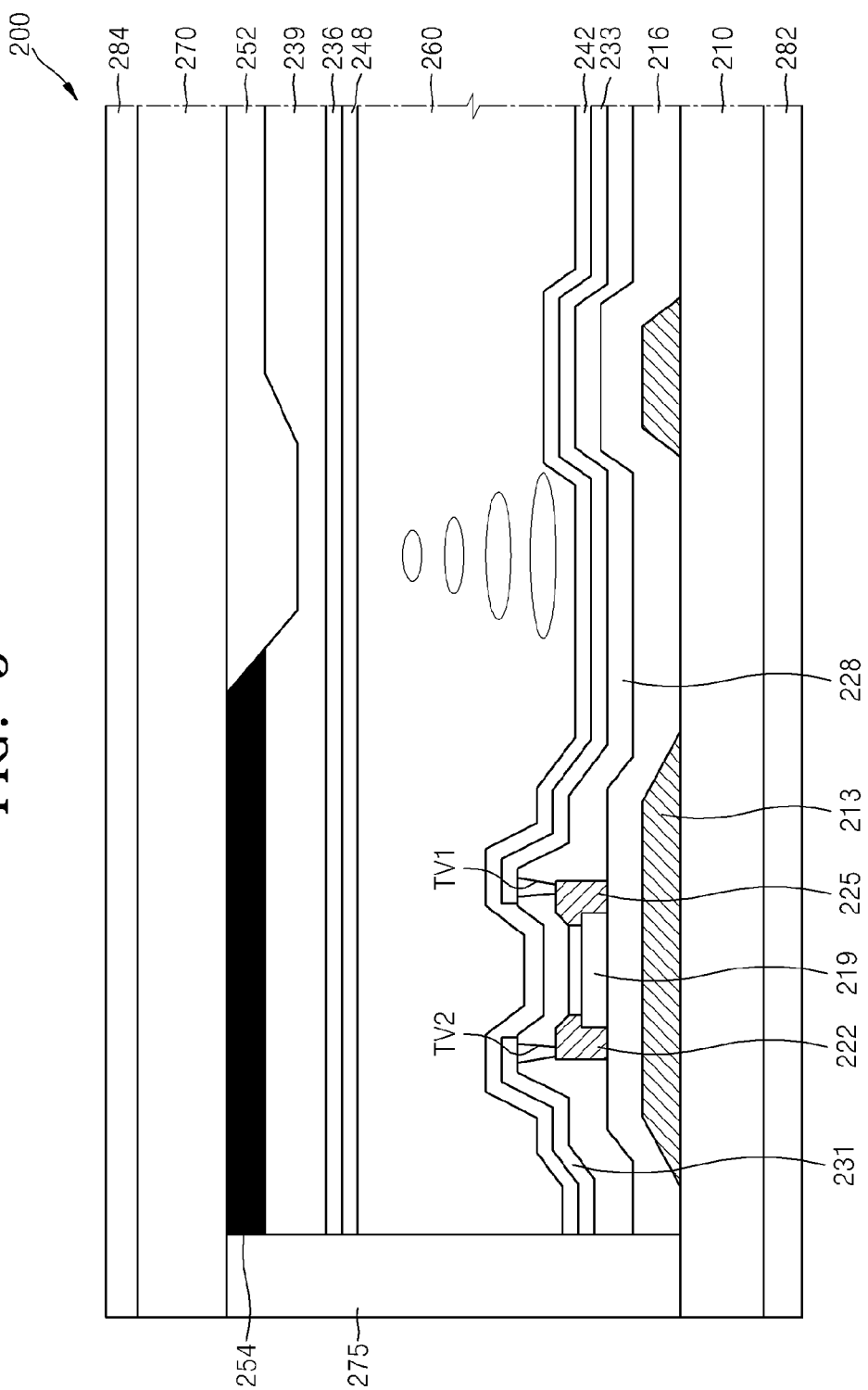
FIG. 5 is a schematic cross-sectional view of a pixel of a display panel according to an embodiment.

FIG. 5 is a schematic cross-sectional view of a pixel of a display panel 200 according to an embodiment.

The display panel 200 includes a display cell 260 and a plurality of pixels each including a driving transistor for controlling an on/off operation of the display cell 260. However, FIG. 5 shows only one pixel.

The display panel 200 may include a rear substrate 210 and a front substrate 270 that are formed of a transparent material so as to face each other, the display cell 260 interposed between the rear substrate 210 and the front substrate 270, and a spacer 275 for dividing two adjacent pixels.

The display cell 260 may be a liquid crystal cell formed of liquid crystals.

The driving transistor for controlling an on/off operation of the display cell 260 is formed on a top surface of the rear substrate 210. The driving transistor includes a gate 213 formed on the rear substrate 210, a first passivation layer 216 covering the gate 213, a channel layer 219 formed on the first passivation layer 216 and formed of a semiconductor material, a source 225 and a drain 222 that are formed at two sides of the channel layer 219 to contact the two sides of the channel layer 219, respectively, a second passivation layer 228 covering all of the channel layer 219, the source 225, and the drain 222, a first transparent electrode layer 233 and a second transparent electrode layer 231 that are formed on the second passivation layer 228 to be spaced apart from each other, a first transparent conductive via TV1 that is formed of a transparent conductive oxide and penetrates the second passivation layer 228 to connect the source 225 and the first transparent electrode layer 233, and a second transparent conductive via TV2 that is formed of a transparent conductive oxide and penetrates the second passivation layer 228 to connect the drain 222 and the second transparent electrode layer 231. A cross-sectional area of the gate 210 is formed larger than a cross-sectional area that the channel layer 219, the source 225, and the drain 222 form together. A structure and a material of the driving transistor are substantially the same as those of the thin film transistor 100 shown in FIG. 1.

Meanwhile, a color filter 252 for defining a color of light to be emitted and a black matrix 254 for covering the driving transistor are partially formed on a bottom surface of the front substrate 270. A third passivation layer 239 is coated to cover the black matrix 254 and the color filter 252, entirely, and a transparent electrode layer 236 is formed under the third passivation layer 239.

A first alignment layer 242 and a second alignment layer 248 may be formed under and on the display cell 260, respectively, to improve interface and orientation characteristics of liquid crystals. Also, a first polarization plate 282 may be formed on a bottom surface of the rear substrate 210, and a second polarization plate 284 may be formed on a top surface of the front substrate 270.

Figure 6:
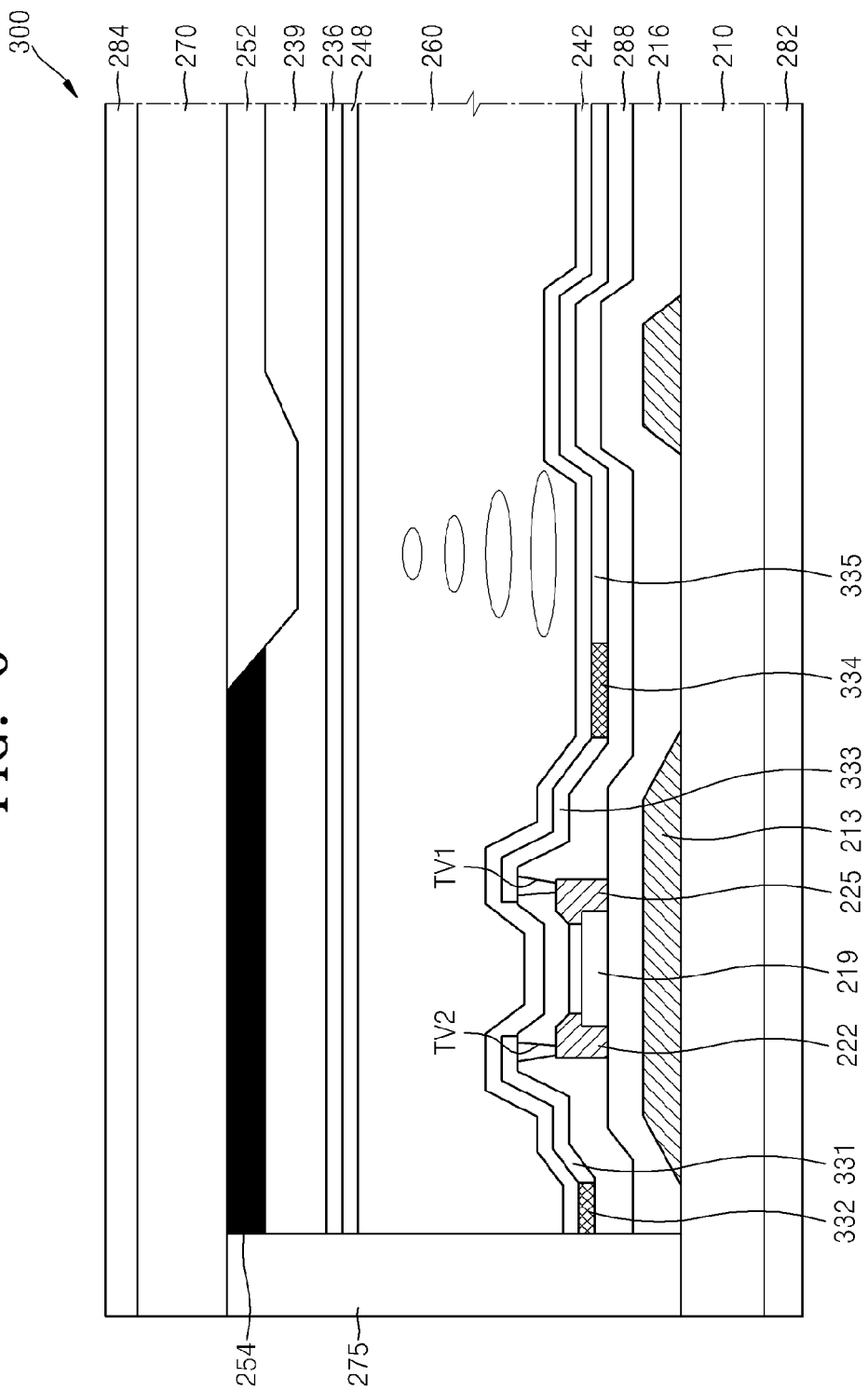
FIG. 6 is a schematic cross-sectional view of a pixel of a display panel according to another embodiment.

FIG. 6 is a schematic cross-sectional view of a pixel of a display panel 300 according to another exemplary embodiment.

As compared with the display panel 200 of FIG. 5, a range in which a first transparent electrode layer 333 and a second transparent electrode layer 331 of the display panel 300 are formed is different from a range in which the first transparent electrode layer 233 and the second transparent electrode layer 231 of the display panel 200 of FIG. 5 are formed. The thin film transistor 100 of FIG. 1 uses a characteristic in which a transparent conductive oxide transmits light to prevent the light from being guided into a channel layer by a drain, a source, and a gate that are formed of a metal capable of reflecting the light, but a transparent conductive oxide has resistance greater than that of a metal material. Accordingly, in the current embodiment as shown in FIG. 6, a range in which a transparent conductive oxide is applied may be further effectively determined in consideration of electric resistance.

As shown in FIG. 6, the first transparent electrode layer 333 extends from the first transparent conductive via TV1 up to an area facing the gate 213, and a first metal electrode layer 334 is formed from an end of the first transparent electrode layer 333 not connected to the first transparent conductive via TV1 up to an area facing the black matrix 254, wherein the first metal electrode layer 334 is formed of a metal material. Next, a third transparent electrode layer 335 is formed to be connected to the first metal electrode layer 334 and to face the color filter 252. For example, the first transparent electrode layer 333 may extend from the first transparent conductive via TV1 up to an area corresponding to an edge of the gate 213, and the first metal electrode layer may extend from the first transparent electrode layer 333 to an area corresponding to an edge of the black matrix 254.

Similarly, the second transparent electrode layer 331 extends from the second transparent conductive via TV2 up to an area facing the gate 213, and a second metal electrode layer 332 is formed from an end of the second transparent electrode layer 331 not connected to the second transparent conductive via TV2 up to an area facing the black matrix 254, wherein the second metal electrode layer 332 is formed of a metal material. For example, the second transparent electrode layer 331 may extend from the second transparent conductive via TV2 up to an area corresponding to an edge of the gate 213, and the second metal electrode layer 332 may extend from the second transparent electrode layer 331 up to an area corresponding to an edge of the black matrix 254.

Figure 7:
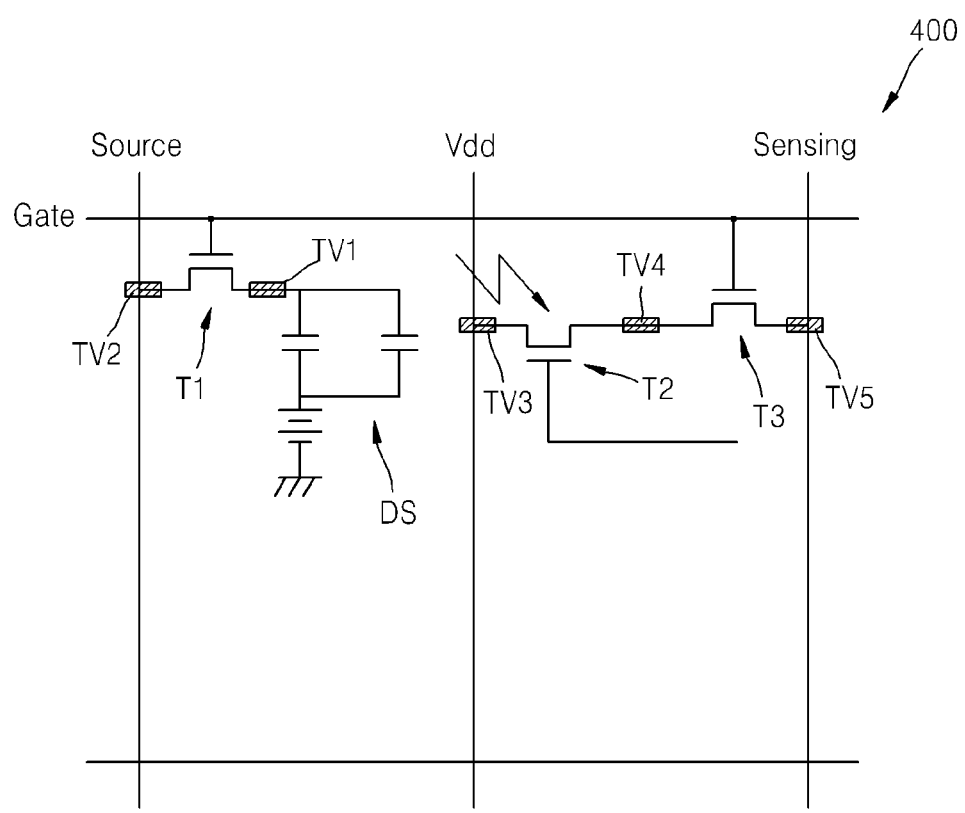
FIG. 7 is a circuit diagram of a pixel of a display panel according to another embodiment.

FIG. 7 is a circuit diagram of a pixel of a display panel 400 according to another embodiment.

The display panel 400 is an optical touch display panel including an optical sensing transistor.

The display panel 400 includes a plurality of pixels each including a display cell DS, a driving transistor T1 for controlling an on/off operation of the display cell DS, an optical sensing transistor T2 for sensing incident light, and a switch transistor T3 for outputting data from the optical sensing transistor T2. In the circuit diagram of FIG. 7, only one pixel is shown.

Configurations of the driving transistor T1, the optical sensing transistor T2, and the switch transistor T3 are substantially the same as the thin film transistor 100 shown in FIG. 1, but a structure and a material of a channel layer may vary according to a specified performance. For example, the optical sensing transistor T2 is specified to be sensitive to light, while the driving transistor T1 and the switch transistor T2 are specified to have a rapid operating speed and stability. For this, structures and materials of channel layers of the driving transistor T1 and the switch transistor T3 may be formed to be different from those of a channel layer of the optical sensing transistor T2.

Gates of the driving transistor T1 and the switch transistor T3 may be connected to one gate line (Gate). Also, a drain of the driving transistor T1 may be connected to an image data line (Source), and a source of the driving transistor T1 may be connected to the display cell DS. The optical sensing transistor T2 may be connected in series to the switch transistor T3. In other words, a drain of the switch transistor T3 may be connected to a source of the optical sensing transistor T2. A source of the switch transistor T3 may be connected to an optical sensing line (Sensing), a drain of the optical sensing transistor T2 may be connected to a driving voltage line Vdd, and a gate of the optical sensing transistor T2 may be connected to a reset line.

A transparent electrode bridge formed of a transparent conductive oxide may be applied to the driving transistor T1, the optical sensing transistor T2, and the switch transistor T3 for connection between electrodes. In other words, a first transparent conductive via TV1 may be formed between the source of the driving transistor T1 and a pixel electrode of the display cell DS, and a second transparent conductive via TV2 may be formed between the drain of the driving transistor T1 and the image data line (Source). Also, a third transparent conductive via TV3 may be formed between the drain of the optical sensing transistor T2 and the driving voltage line Vdd, a fourth transparent conductive via TV4 may be formed between the drain of the switch transistor T3 and the source of the optical sensing transistor T2, and a fifth transparent conductive via TV5 may be formed between the source of the switch transistor T3 and the optical sensing line (Sensing).

In this structure, if a gate voltage is applied to the driving transistor T1 and the switch transistor T3 via the gate line (Gate), the driving transistor T1 and the switch transistor T3 are in an on-state. Then, an image signal of the image data line (Source) is applied to the display cell DS, and thus the display cell DS displays an image. Meanwhile, current is applied from the source of the optical sensing transistor T2 to the optical sensing line (Sensing). At this time, the amount of current applied from the optical sensing transistor T2 to the optical sensing line (Sensing) varies according to intensity of light incident on the optical sensing transistor T2. Accordingly, intensity of light incident on the optical sensing transistor T2 may be calculated by measuring the amount of current applied to the optical sensing line (Sensing). In order to output an optical sensing signal, a voltage lower than a threshold voltage is applied to the gate of the optical sensing transistor T2 while the switch transistor T3 is in an on-state. Meanwhile, if the optical sensing transistor T2 is in an off-state while a gate voltage is not applied to the switch transistor T3, current is not applied to the optical sensing line (Sensing). Accordingly, an optical sensing signal may be output by controlling the switch transistor T3, and it may be determined whether light is incident on the optical sensing transistor T2 by using magnitude of the optical sensing signal, and also intensity of light may be determined by using the magnitude of the optical sensing signal. After the optical sensing transistor T2 measures light once, a positive gate voltage may be applied to the gate of the optical sensing transistor T2 via the reset line for a next measurement.

In the above description, five transparent conductive vias TV1 to TV5 have been exemplified. However, this is just an example, and one or some of the transparent conductive vias TV1 to TV5 may be omitted according to a position of a path through which external light is incident.

The above-described thin film transistor has a structure in which incidence of external light on a channel layer is minimized, and thus electro-optic reliability is high. Also, an additional mask is not required during manufacturing of the thin film transistor, as compared with a conventional process of forming a thin film transistor, and thus the thin film transistor may be easily manufactured.

Thus, the thin film transistor of the present inventive concept may be applied to a driving transistor or a switch transistor for display, an optical sensing transistor for display having an optical touch function, or the like.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A display panel comprising a plurality of pixels each comprising a display cell and a driving transistor that controls an on and off operation of the display cell, wherein the driving transistor comprises:
   a gate;
   a first passivation layer covering the gate;
   a channel layer disposed on the first passivation layer;
   a source disposed on and contacting the first passivation layer and contacting a first side of the channel layer;
   a drain disposed on the first passivation layer and contacting a second side of the channel layer;
   a second passivation layer covering the channel layer, the source, and the drain;
   a first transparent electrode layer disposed on the second passivation layer;
   a second transparent electrode layer disposed on the second passivation layer and spaced apart from the first transparent electrode layer;
   a first transparent conductive via that penetrates the second passivation layer and connects the source and the first transparent electrode layer; and
   a second transparent conductive via that penetrates the second passivation layer and connects the drain and the second transparent electrode layer, the second transparent conductive via being spaced apart from the first transparent conductive via along a first direction,
   wherein a cross-sectional area of the gate is larger than a cross-sectional area of the channel layer, the source, and the drain combined, and
   wherein a distance between the first transparent conductive via and the second transparent conductive via is shorter than a width of the gate along the first direction.

2. The display panel of claim 1, wherein the display cell comprises a liquid crystal cell.

3. The display panel of claim 1, wherein a size of an area where the source and the drain contact the first passivation layer is such that light, which is obliquely incident from a lateral bottom side of the gate in a direction in which the light is not directed to the gate, transmits through the first transparent electrode layer and the second transparent electrode layer without facing the area where the source and the drain contact the first passivation layer.

4. The display panel of claim 1, wherein the source, the drain, and the gate comprise a metal material, and the channel layer comprises a semiconductor material.

5. The display panel of claim 1, wherein the first transparent electrode layer, the second transparent electrode layer, the first transparent conductive via and the second transparent conductive via comprise a transparent conductive oxide.

6. The display panel of claim 1, wherein the channel layer comprises an oxide semiconductor.

7. The display panel of claim 1, wherein a black matrix and a color filter are disposed on each of the pixels, the first transparent electrode layer extends from the first transparent conductive via up to an area corresponding to the gate, and a metal electrode is formed from an end of the first transparent electrode layer not connected to the first transparent conductive via up to an area corresponding to the black matrix.

8. The display panel of claim 1, wherein a black matrix and a color filter are disposed on each of the pixels, the second transparent electrode layer extends from the second transparent conductive via up to an area corresponding to the gate, and a metal electrode is formed from an end of the second transparent electrode layer not connected to the second transparent conductive via up to an area corresponding to the black matrix.

9. The display panel of claim 1, wherein the second passivation layer entirely covers the channel layer, the source, and the drain.

10. An optical touch display panel comprising a plurality of pixels each comprising a driving transistor that controls an on and off operation of the display cell, an optical sensing transistor that senses incident light, and a switch transistor that outputs data from the optical sensing transistor, and at least one of the driving transistor, the optical sensing transistor, and the switch transistor comprises:
 a gate;
 a first passivation layer covering the gate;
 a channel layer disposed on the first passivation layer;
 a source disposed on and contacting the first passivation layer and contacting a first side of the channel layer;
 a drain disposed on the first passivation layer and contacting a second side of the channel layer;
 a second passivation layer covering the channel layer, the source, and the drain;
 a first transparent electrode layer disposed on the second passivation layer;
 a second transparent electrode layer disposed on the second passivation layer and spaced apart from the first transparent electrode layer;
 a first transparent conductive via that penetrates the second passivation layer and connects the source and the first transparent electrode layer; and
 a second transparent conductive via that penetrates the second passivation layer and connects the drain and the second transparent electrode layer, the second transparent conductive via being spaced apart from the first transparent conductive via along a first direction,
 wherein a cross-sectional area of the gate is larger than a cross-sectional area of the channel layer, the source, and the drain combined, and
 wherein a distance between the first transparent conductive via and the second transparent conductive via is shorter than a width of the gate along the first direction.

11. The optical touch display panel of claim 10, wherein the display cell comprises a liquid crystal cell.

12. The optical touch display panel of claim 10, wherein a size of an area where the source and the drain contact the first passivation layer is such that light, which is obliquely incident from a lateral bottom side of the gate in a direction in which the light is not directed to the gate, transmits through the first transparent electrode layer and the second transparent electrode layer without facing the area where the source and the drain contact the first passivation layer.

13. The optical touch display panel of claim 10, wherein the source, the drain, and the gate comprise a metal material, and the channel layer comprises a semiconductor material.

14. The optical touch display panel of claim 10, wherein the first transparent electrode layer, the second transparent electrode layer, the first transparent conductive via and the second transparent conductive via comprise a transparent conductive oxide.

15. The optical touch display panel of claim 10, wherein the channel layer comprises an oxide semiconductor.

16. The optical touch display panel of claim 10, wherein a black matrix and a color filter are disposed on each of the pixels, the first transparent electrode layer extends from the first transparent conductive via up to an area corresponding to the gate, and a metal electrode is formed from an end of the first transparent electrode layer not connected to the first transparent conductive via up to an area corresponding to the black matrix.

17. The optical touch display panel of claim 10, wherein a black matrix and a color filter are disposed on each of the pixels, the second transparent electrode layer extends from the second transparent conductive via up to an area corresponding to the gate, and a metal electrode is formed from an end of the second transparent electrode layer not connected to the second transparent conductive via up to an area corresponding to the black matrix.

18. The optical touch display panel of claim 10, wherein the second passivation layer entirely covers the channel layer, the source, and the drain.

* * * * *